United States Patent [19]
Nakamura

[11] Patent Number: 5,378,905
[45] Date of Patent: Jan. 3, 1995

[54] FERROELECTRIC FIELD EFFECT TRANSISTOR WITH FLUORIDE BUFFER AND IV-VI FERROELECTRIC

[75] Inventor: Takashi Nakamura, Kyoto, Japan
[73] Assignee: Rohm Co., Ltd., Kyoto, Japan
[21] Appl. No.: 19,447
[22] Filed: Feb. 18, 1993

[30] Foreign Application Priority Data

Feb. 24, 1992 [JP] Japan ................. 4-036424

[51] Int. Cl.$^6$ .................. H01L 29/68; H01L 29/784; H01L 29/92
[52] U.S. Cl. ..................... 257/213; 257/42; 257/613; 257/616; 257/631; 257/633; 257/635
[58] Field of Search ............. 257/42, 524, 613, 616, 257/631, 633, 635, 638, 213; 365/109, 117, 145

[56] References Cited

U.S. PATENT DOCUMENTS

5,218,512  6/1993  Nakamura ................ 365/145

FOREIGN PATENT DOCUMENTS

55-128873  10/1980  Japan .
3-227052  10/1991  Japan .

OTHER PUBLICATIONS

Zogg et al., "Heteroepitaxial PbTe—Si and (Pb,Sn)Se—Si Structures for Monolithic 3-5 μm and 8-12 μm Infrared Sensor Arrays", IEDM, 1985, pp. 121–124.
Maissen et al., "Photovoltaic Infrared Sensors in Heteroepitaxial PbTe in Si", Appl. Phys. Lett. vol. 53, No. 17, Oct. 24, 1988, pp. 1608–1610.
Asano et al., "Heteroepitaxial Growth of Group-IIa-Fluoride Films on Si Substrates" Japanese Journal of Applied Physics, vol. 22, No. 10, Oct. 1983, pp. 1474–1481.
Ishiwara et al., "Control of Crystal Orientations in Lattice-Mismatched SrF$_2$ and (Ca,Sr)F$_2$ Films on Si Substrates by Intermediate CaF$_2$ Films", Japanese Journal of Applied Physics, vol. 24, No. 1, Jan. 1985, pp. L56–L58.
Zogg, "Strain Relief in Epitaxial Fluoride Buffer Layers for Semiconductor Heteroepitaxy", Appl. Phys. Lett., vol. 49, No. 15, Oct. 13, 1986, pp. 933–935.

Primary Examiner—Jerome Jackson
Assistant Examiner—Alice W. Tang
Attorney, Agent, or Firm—Steven M. Rabin

[57] ABSTRACT

There is interposed a buffer film composed of IIa group fluoride and having characteristics of orientation to a surface direction (111), in which mismatching in lattice constant with a crystal element of a semiconductor substrate is large and mismatching in lattice constant with IV-VI group compound ferroelectric substance is small, between the semiconductor substrate having a surface direction (100) and a ferroelectric gate film comprising the IV-VI group compound ferroelectric substance and having characteristics of polarization to the surface direction (111). Since the buffer film is an orientation film in the direction of (111) without influenced by a crystal element of the semiconductor substrate serving as a base material, the ferroelectric gate film can be oriented in the direction of (111) which is the same as the direction of polarization of the ferroelectric substance.

16 Claims, 4 Drawing Sheets 5,378,905

FERROELECTRIC FIELD EFFECT TRANSISTOR WITH FLUORIDE BUFFER AND IV-VI FERROELECTRIC

BACKGROUND OF THE INVENTION

1. Field of Invention

The present invention relates to a field effect transistor and more particularly, to a field effect transistor having a ferroelectric gate film, which is used in a nonvolatile memory or the like.

2. Description of Prior Art

FIG. 4 is a schematic sectional view showing a structure of a conventional field effect transistor having a ferroelectric gate film (referred to as a MFSFET (Metal Ferroelectric Semiconductor Field Effect Transistor) hereinafter), which is used in a nonvolatile memory or the like.

Referring to FIG. 4, reference numeral 1 designates a P-type silicon substrate, reference numerals 2a and 2b designate N-type impurity diffused layers serving as source and drain regions, which are formed on a surface of the silicon substrate 1 at a predetermined interval, reference numeral 3 designates a ferroelectric gate film provided on a channel region 2c sandwiched by the N-type impurity diffused layers 2a and 2b, reference numeral 4 designates a gate electrode formed on the ferroelectric gate film 3, reference numerals 5a and 5b designate source/drain electrode wirings connected to the N-type impurity diffused layers 2a and 2b, respectively, and reference numeral 6 designates an interlaminar insulating film for insulating from each other the gate electrode 4 and the source/drain electrode wirings 5a and 5b. In this structure, the gate electrode 4 and the ferroelectric gate film 3 provide a so called MFS structure. Furthermore, it is possible to interpose a buffer film between the gate electrode 4 and the ferroelectric gate film 3 or between the ferroelectric gate film 3 and the channel region 2c.

Although as a ferroelectric material, $ABO_3$ type (A, B: metal element) such as PZT, PLZT, $PbTiO_3$, $BaTiO_3$, which has the perovskite structure is generally used, a material showing ferroelectricity may be used. Besides, halogen compounds such as $BaMgF_4$, $NaCaF_3$, $K_2ZnCl_4$ or chalcogen compounds such as $Zn_{1-x}Cd_xTe$, GeTe or $Sn_2P_2S_6$ may be used.

The ferroelectric substance in the MFSFET has P–E hysteresis characteristics shown in FIG. 5. Referring to FIG. 5, a voltage which applies an electric field $E_{sat}$ to the ferroelectric substance is assumed to be $V_{max} (>0)$. When a voltage $+V_{max}$ is applied to the gate electrode 4 of the MFSFET shown in FIG. 4, the ferroelectric gate film 3 is polarized to a state of A, whereby a channel 2c is formed. Thereafter, even if the voltage of the gate electrode 4 is reduced to 0, polarization of the film 3 becomes a state of B, which means that a residual polarization known as spontaneous polarization remains in the ferroelectric gate film 3 and the channel 2c still exists. Meanwhile, when a voltage $-V_{max}$ is applied to the gate electrode 4 (or the voltage $+V_{max}$ is applied to the substrate 1), the ferroelectric gate film 3 is polarized to a state of C. When the voltage is set to 0, polarization of the film 3 becomes a state of D. In this case, the channel 2c is not formed.

However, in the MFSFET, the ferroelectric gate film is formed by directly laminating an oxide ferroelectric substance such as PZT or a fluoride ferroelectric substance such as $BaMgF_4$ on the silicon substrate, so that it does not reach a level of practical use.

More specifically, when the oxide ferroelectric substance is used, the following problems (1) to (3) are generated.

(1) When the oxide ferroelectric substance is laminated on the silicon substrate, an unnecessary film such as $SiO_2$ is generated between the ferroelectric substance and the silicon substrate. In order to reverse polarization of the ferroelectric substance, it is necessary to generate an electric field in the ferroelectric substance by applying a voltage between the gate electrode and the silicon substrate. Incidentally, when the unnecessary film is formed between the ferroelectric substance and the silicon substrate as described above, a laminated capacitor structure is provided. Therefore, in order to generate a sufficient electric field in the ferroelectric substance, it is necessary to increase an applied voltage. As a result, a trap level is increased and then electron is trapped at an interface between the unnecessary film and the silicon substrate or in the unnecessary film. Consequently, transistor characteristics in itself can not be obtained.

(2) Processing at high temperature is necessary. More specifically, a crystallization temperature of the oxide ferroelectric substance is generally high. For example, PZT is crystallized at approximately 600° C. or more, which is a big problem in a case where Pb or the like is diffused into the silicon substrate and matching with the silicon process is considered.

(3) Its crystal structure is complicated, causing some problems. More specifically, since the oxide ferroelectric substance has to be mixed with three elements or more, its crystal structure becomes complicated, making a film forming process difficult. In addition, if reversal of polarization is often repeated, crystallizability could deteriorate.

Meanwhile, when the fluoride ferroelectric substance is used, although the above problem (1) is not generated, the problems (2) and (3) are still unsolved.

3. Description of the Related Art

In order to solve the above problems, the inventor of the present invention has proposed a technique in which a IV–VI group compound ferroelectric substance, represented by GeTe is used as the ferroelectric substance in Japanese Patent Application No. 306561/1991.

The IV–VI group compound ferroelectric substance, represented by GeTe shows polarization in the direction (111). As an LSI (Large Scale Integrated Circuit) substrate such as a nonvolatile memory device, a silicon substrate having a crystalline orientation (100) on a surface thereof is mainly used at present. When the IV–VI group compound ferroelectric substance, represented by GeTe is used, it is preferable that an orientation film of the ferroelectric substance is formed, with a crystalline orientation (111), on the surface of the silicon substrate having a crystalline orientation (100), with regard to matching with the present process technique. This is because when the ferroelectric gate film is formed with a crystalline orientation (111), ferroelectricity, when residual polarization exists or coesive electric field is applied, is superior to that when the ferroelectric gate film is formed with a crystalline orientation (100). Consequently, an operation voltage of the MFSFET is reduced and a process margin can be increased.

However, in the technique disclosed in the Japanese Patent Application No. 306561/1991, since a buffer film comprising CaF$_2$ or the like is interposed between the silicon substrate and the ferroelectric gate film, it is difficult to form an orientation film comprising the IV-VI group compound ferroelectric substance with a crystalline orientation (111), on a surface of crystalline orientation (100) of a silicon substrate.

More specifically, since a lattice constant of CaF$_2$ matches well to that of silicon in the silicon substrate and then mismatching in lattice constant is too small, approximately 0.6%, the film is likely to be influenced by the silicon of the silicon substrate which is placed under the CaF$_2$, so that the orientation film is formed with a crystalline orientation (100). Therefore, although the IV-VI group compound ferroelectric substance shows polarization in the direction (111), the film has a crystalline orientation (100).

SUMMARY OF THE INVENTION

It is an object of the present invention to provide an MFSFET in which a film formed of a IV-VI group compound ferroelectric substance has a crystalline orientation (111) on a semiconductor substrate of crystalline orientation (100), on a surface thereof.

According to an MFSFET of the present invention, between a semiconductor substrate having a crystalline orientation (100) on a surface thereof and a ferroelectric gate film comprising an IV-VI group compound having characteristics of polarization in the direction (111), there is interposed a buffer film comprising IIa group fluoride which has characteristics of crystalline orientation (111), in which mismatching in lattice constant with a crystal element of the semiconductor substrate is large and mismatching in lattice constant with the IV-VI group compound ferroelectric substance is small.

In the manufacturing process of the MFSFET, the buffer film has a crystalline orientation (111) without being influenced by the crystal element of the semiconductor substrate. As a result, the ferroelectric gate film has a crystalline orientation (111) and the spontaneous polarization of the ferroelectric substance is in the (111) direction.

These objects and other objects, features, aspects and advantages of the present invention will become more apparent from the following detailed description of the present invention when taken in conjunction with the accompanying drawings.

DESCRIPTION OF PREFERRED EMBODIMENTS

An embodiment of the present invention will be described in reference to the drawings hereinafter.

Figure 1:
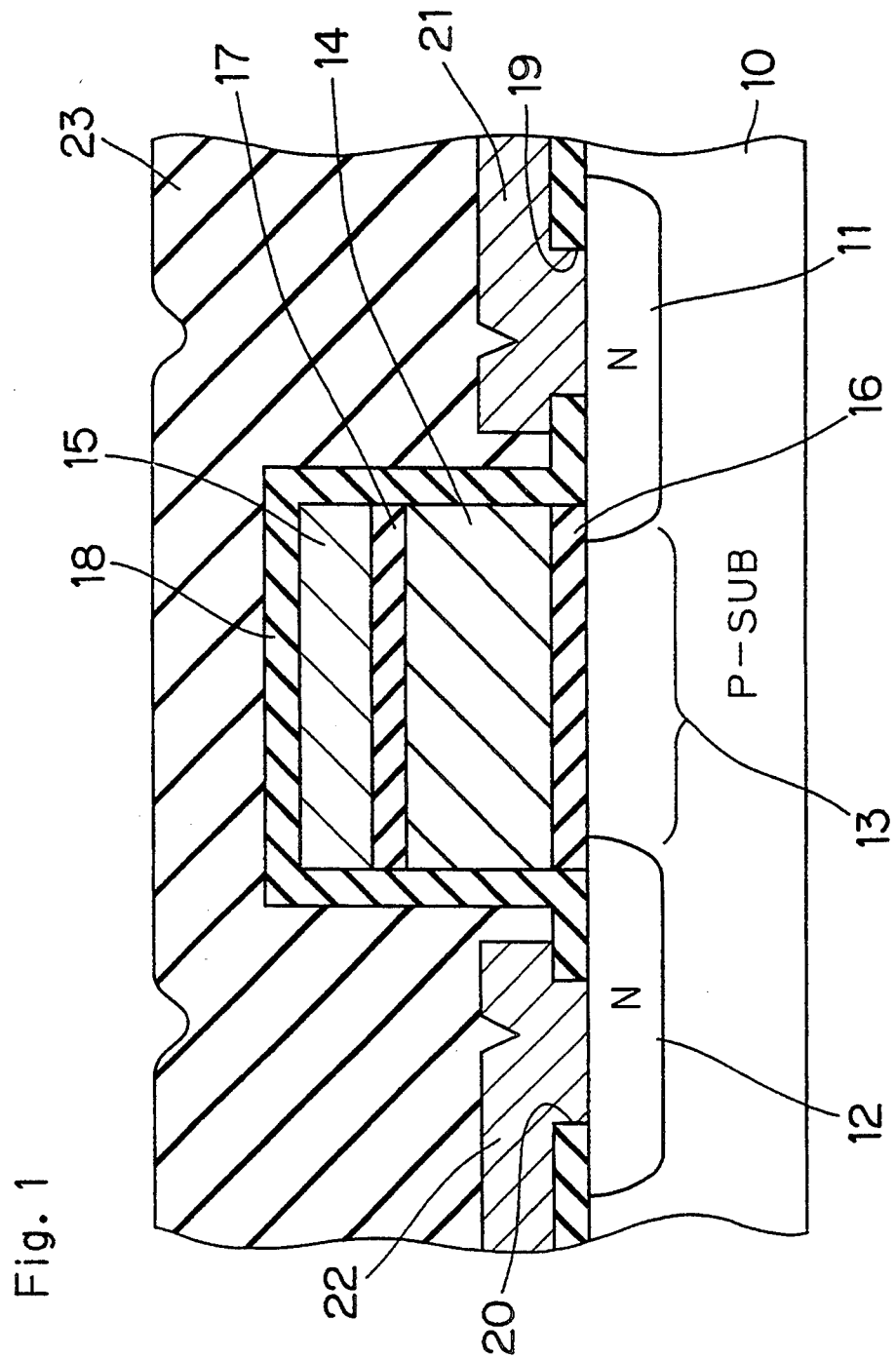
FIG. 1 is a schematic sectional view showing a structure of an MFSFET according to an embodiment of the present invention.

FIG. 1 is a schematic sectional view showing a structure of an MFSFET in accordance with the embodiment of the present invention. Referring to FIG. 1, the structure of the MFSFET will be described.

The MFSFET according to the embodiment of the present invention is used in a nonvolatile memory device or the like, in which information is stored by taking an electric charge in or out of a ferroelectric gate film.

Referring to FIG. 1, reference numeral 10 designates a P-type silicon substrate having a crystalline orientation (100) on a surface thereof. On the surface of the silicon substrate 10, there are formed N-type impurity diffused layers 11 and 12 serving as source and drain regions at a predetermined interval and a channel region 13 is formed between the impurity diffused layers 11 and 12.

A ferroelectric gate film 14 is disposed on the channel region 13 and a gate electrode 15, formed of an electrically conductive material such as polysilicon or metal, is disposed on the ferroelectric gate film 14.

A first buffer film 16 is interposed between the silicon substrate 10 and the ferroelectric gate film 14 as a bridge between the impurity diffused layers 11 and 12. A second buffer film 17 is interposed between the ferroelectric gate film 14 and the gate electrode 15.

The whole surface of the silicon substrate 10 is covered with an interlaminar insulating film 18 comprising an insulating material such as BPSG (boron-phosphosilicate glass) in which boron is mixed in PSG (phosphosilicate glass) which is SiO$_2$ doped with phosphorous. Contact holes 19 and 20 are formed in the interlaminar insulating film 18 at portions corresponding to the N-type impurity diffused layers 11 and 12. The source and drain electrode wirings 21 and 22 formed of electrically conductive material such as Al are in contact with the N-type impurity diffused layers 11 and 12 through the contact holes 19 and 20, respectively. Therefore, the gate electrode 15 and the electrode wirings 21 and 22 are insulated from each other by the interlaminar insulating film 18. Furthermore, a passivation film 23 comprising an insulating material such as PSG is laminated on the electrode wirings 21 and 22 so as to cover the whole surface of the silicon substrate 10 in order to protect the surface of the MFSFET and to prevent a pollutant from entering from the outside.

The ferroelectric gate film 14 is formed of a IV-VI group compound ferroelectric substance which has characteristics of polarization in the surface direction (111). The buffer films 16 and 17 are formed of IIa group fluoride having characteristics of crystalline orientation (111) in which mismatching in lattice constant with silicon of the silicon substrate 10 is large and mismatching in lattice constant with the IV-VI group compound ferroelectric substance is small.

Although GeTe is employed as the IV-VI group compound ferroelectric substance in the following description, other IV-VI group compound showing ferroelectricity such as Pb$_x$GeTe$_{1-x}$ (0<x<1) or GeTe$_x$Se$_{1-x}$ (0<x<1) may be employed.

In a case of GeTe, since a lattice constant a of GeTe is approximately 5.99 Å, the IIa fluoride serving as the first buffer film 16 which is interposed between the silicon substrate 10 and the ferroelectric gate film 14, preferably has a lattice constant close to that of GeTe. In this respect, SrF$_2$ and BaF$_2$ are preferable because the lattice constant of SrF$_2$ is approximately 5.8 Å and the lattice constant of BaF$_2$ is approximately 6.20 Å. These lattice constants differ from the 5.99 Å lattice constant of GeTe by 3.2% and 3.5%, respectively. In addition, referring to the degree of mismatching in lattice constant with silicon, it is approximately 6.8% in the case of $SrF_2$ and it is approximately 14% in the case of $BaF_2$, both are larger than that in a case of $CaF_2$ (approximately 0.6%). Besides, a mixed crystal in which $SrF_2$ and $BaF_2$ are mixed in appropriate ratio, that is, $Sr_xBa_{1-x}F_2$ ($0<x<1$) may be used. If the mixed crystal $Sr_xBa_{1-x}F_2$ is used, the mismatching in lattice constant with GeTe can be almost 0.

The buffer film 16 may be a single-layer structure of $SrF_2$, $BaF_2$ or $Sr_xBa_{1-x}F_2$ or a two-layer structure of $Sr_xBa_{1-x}F_2$ and $SrF_2$ or $Sr_xBa_{1-x}F_2$ and $BaF_2$. Furthermore, the buffer film 16 may be formed by laminating $Sr_xBa_{1-x}F_2$ so as to gradually varying a value x of $Sr_xBa_{1-x}F_2$ toward the ferroelectric gate film 14 from 0 to 0.5 (referred to as a graded layer hereinafter). Consequently, the mismatching in lattice constant with silicon is large so that orientation to (111) may be likely to be generated at a part close to the silicon substrate 10 and the mismatching in lattice constant with GeTe is reduced at a part close to GeTe.

In addition, while a thermal expansion coefficient of GeTe is approximately $2 \times 10^{-6} cm^3/° C.$, each of the thermal expansion coefficients of $SrF_2$ and $BaF_2$ is approximately $1.8 \times 10^{-6} cm^3/° C.$ Therefore, a crystal defect such as a crack will not be generated in GeTe by heat.

In addition, since the IIa group fluoride has a fluorite structure which is similar to a zinc-blended structure of silicon, it is likely to be epitaxially grown on the silicon substrate 10 and superior in insulation because its coefficient of electrical resistance is $10^{17} \Omega \cdot cm^2/° C.$ or more because of its close-packed structure.

More specifically, in the MFSFET according to the embodiment of the present invention, between the P-type silicon substrate 10 of the crystalline orientation (100) on a surface thereof and the ferroelectric gate film 14 formed of the IV–VI group compound ferroelectric substance which has characteristics of polarization in the surface direction (111), there is interposed the buffer film 16 formed of IIa group fluoride having characteristics of crystalline orientation (111) in which mismatching in lattice constant with silicon is large and mismatching in lattice constant with the ferroelectric substance is small.

FIGS. 2(a) to (d) and FIGS. 3(a) and (b) are schematic sectional views showing steps for manufacturing of the MFSFET. Referring to FIGS. 2(a) to (d) and FIGS. 3(a) and (b), the steps for manufacturing the MFSFET will be described.

Figure 2A:
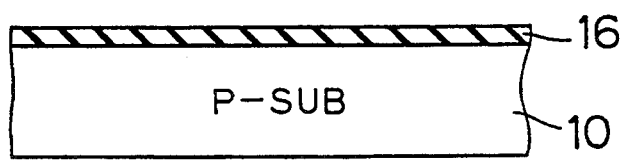
FIG. 2a-2d are schematic sectional views showing manufacturing steps of the same.

As shown in FIG. 2(a), the first buffer film 16 is formed on the P-type silicon substrate 10 whose crystalline orientation on the surface thereof is (100). As described above, the structure of the buffer film 16 may be a single-layer structure of $SrF_2$, $BaF_2$ or $Sr_xBa_{1-x}F_2$ ($0<x<1$), a two-layer structure of $Sr_xBa_{1-x}F_2$ ($0<x<1$) and $SrF_2$ or $Sr_xBa_{1-x}F_2$ ($0<x<1$) and $BaF_2$, or a graded-layer structure in which $Sr_xBa_{1-x}F_2$ is laminated while a value x of $Sr_xBa_{1-x}F_2$ is varied from 0 to 0.5 toward the ferroelectric gate film, that is, in the upward direction. The film is well epitaxially grown by the most simple vapor deposition method at a substrate temperature of 400° to 600° C. In order to improve the epitaxial growth and easily control a composition ratio of the graded layer of $Sr_xBa_{1-x}F_2$, the following method, that is, an MBE (Molecular Beam Epitaxy) method, a CIB (Cluster Ion Beam) method, a CVD (Chemical Vapor Deposition) method or a sputtering method may be used. However, when the MBE method, the CIB method, the CVD method or the sputtering method is used, since crystallizability of a base material, that is, a silicon of the silicon substrate 10 exerts an influence on the film, it is difficult to form an (111) orientation film of $SrF_2$, $BaF_2$ or $Sr_xBa_{1-x}F_2$ on the silicon substrate of crystalline orientation (100) on the surface thereof. Then, if the film is annealed once for a short time (for example, approximately 10 seconds at 1,000° C.) during an initial stage of the film forming process in which a film thickness is approximately 30 Å or less, the (100) orientation is switched to the (111) orientation. Although the film thickness is preferably thin as far as a relative dielectric constant is concerned, it has to be several 100 to 1000 Å to assure insulation.

Figure 2B:
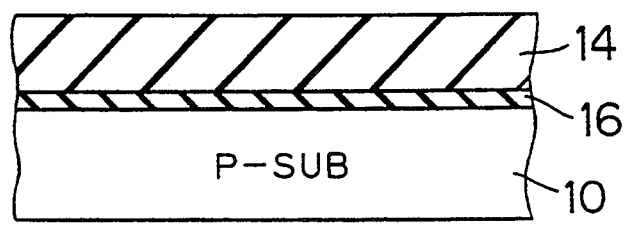

Then, as shown in FIG. 2(b), the ferroelectric gate film 14 is laminated by epitaxially growing GeTe on the first buffer film 16. Although the gate film 14 is formed by the same method as that of the buffer film 16, since its crystallization temperature is approximately 240° C., the temperature while the film is formed has to be at least at 240° C. Although its film thickness is also preferably thin like the buffer film 16, it has to be several 100 to 1000 Å in order to provide a film having good crystallizability.

Figure 2C:
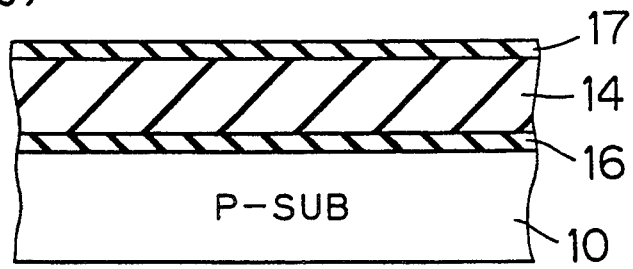

Then, as shown in FIG. 2(c), the second buffer film 17 is laminated on the ferroelectric gate film 14 by epitaxial growth like the step shown in FIG. 2(a). The reason why the second buffer film 17 is formed on the ferroelectric gate film 14 is that there are some substances having relatively high electric conductivity in the IV–VI group compound ferroelectric substance. In addition, $Sr_xBa_{1-x}F_2$ ($0<x<1$) is preferably used as the buffer material. However, the process for laminating the buffer film 17 may be dispensed with if electrical characteristics are not degraded.

Figure 2D:
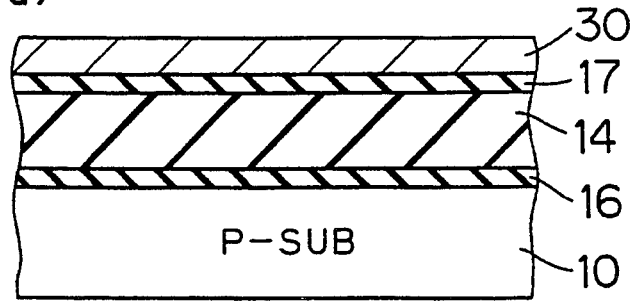

Then, as shown in FIG. 2(d), the electrically conductive material 30 such as polysilicon or metal serving as the gate electrode is laminated on the second buffer film 17 by the CVD method.

Figure 3A:
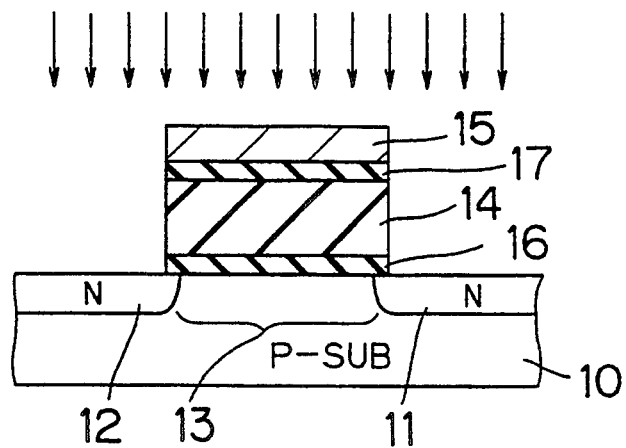
FIG. 3a-3b are schematic sectional views showing the manufacturing steps continued from FIG. 2.

Then, as shown in FIG. 3(a), a resist pattern (not shown) is formed at a predetermined region in the electrically conductive material 30 and then the electrically conductive material 30, the second buffer film 17, the ferroelectric gate film 14 and the first buffer film 16 are removed by dry etching such as RIE (reactive ion etching) to form the gate electrode 15. Then, P+ and As+ of the N-type impurity are implanted into the P-type silicon substrate 10 by an ion implantation method using the gate electrode 15, the second buffer film 17, the ferroelectric gate film 14 and the first buffer film 16 as masks, whereby the N-type impurity diffused layers 11 and 12 serving as source and drain regions are formed in a self-alignment manner so as to sandwich the channel region 13.

Figure 3B:
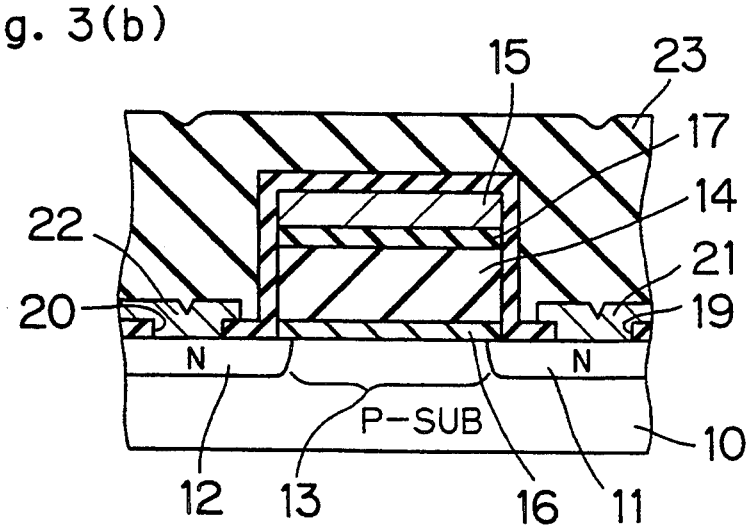
Figure 4:
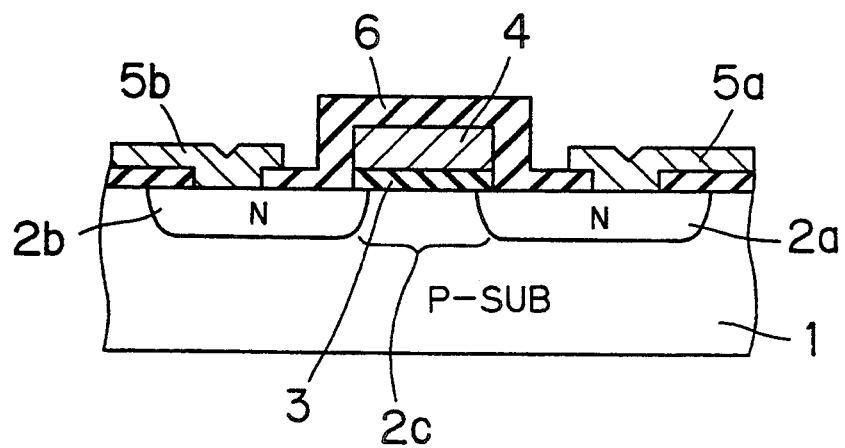
FIG. 4 is a schematic sectional view showing a structure of a conventional MFSFET.
Figure 5:
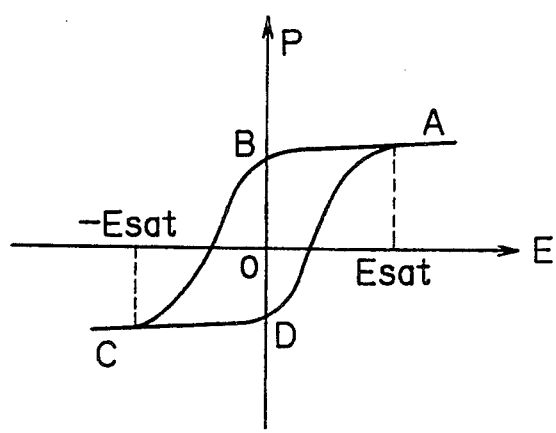
FIG. 5 is a view showing P-E hysteresis characteristics of a ferroelectric substance in the conventional MFSFET shown in FIG. 4.

Then, as shown in FIG. 3(b), the interlaminar insulating film 18 is formed by depositing BPSG on the whole surface by the CVD method. Then, the surface of the interlaminar insulating film 18 is made flat by reflow. Then, a resist (not shown) is coated on the whole surface for mask alignment and holes are formed in the resist only at outlets for the wiring. Then, the interlaminar insulating film 18 is etched away by the RIE method using the resist as a mask and then the contact holes 19 and 20 are formed on the N-type impurity diffused layers 11 and 12, respectively. Then, the resist is removed and then for example, Al is deposited on the whole surface by, for example, sputtering. Then, a pattern is formed on each of the electrode wiring 21 and 22 using the mask alignment and the RIE. Then, for example PSG is deposited on the whole surface by the CVD method to form the passivation film 23.

In the step of forming the first buffer film 16 shown in FIG. 2(a), since there is used as the buffer material the IIa group fluoride having characteristics of crystalline orientation (111), in which mismatching in lattice constant with silicon of the silicon substrate 10 is large and mismatching in lattice constant with the IV-VI group compound ferroelectric substance is small, the buffer film 16 becomes an orientation film with a crystalline orientation (111) without influence by the silicon of the silicon substrate 10 serving as a base material. Therefore, in the step of forming the ferroelectric gate film 14 using the IV-VI group compound ferroelectric substance which has characteristics of polarization in the direction (111) as shown in FIG. 2(b), the ferroelectric gate film has a crystalline orientation (111) wherein the direction of the spontaneous polarization of the ferroelectric substance is (111).

Thus, since the orientation film of the ferroelectric substance is formed with a crystalline orientation of (111) on the silicon substrate 10 having a crystalline orientation (100) on its surface, the ferroelectric gate film 14 is superior in ferroelectricity when residual polarization exists or coersive electric field is applied. As a result, an operation voltage of the MFSFET can be reduced and the process margin can be increased.

Although the present invention was described by using the P-type silicon substrate in the above embodiment, it is needless to say that the N-type silicon substrate may be used in stead of the P type substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect transistor, comprising:
   a semiconductor substrate of a predetermined first electrically conductive type, including a crystal element having a crystalline orientation (100) on a surface thereof;
   impurity diffused layers of a second electrically conductive type opposite to said first electrically conductive type, formed on said surface of said semiconductor substrate, said impurity diffused layers spaced from each other by a predetermined interval and serving as source and drain regions;
   a channel region sandwiched between said impurity diffused layers;
   a ferroelectric gate film disposed on said channel region and comprising a group IV-VI compound ferroelectric substance having characteristics of crystalline orientation (111) and spontaneous polarization in the direction (111);
   a gate electrode disposed on said ferroelectric gate film; and
   a buffer film interposed between said surface of said crystal element and said ferroelectric gate film, said buffer film comprising a group IIa fluoride having characteristics of crystalline orientation (111), wherein a degree of mismatch in lattice constant between said group IIa fluoride and said surface of said crystal element is large enough to avoid influence on the characteristics of orientation of said group IIa fluoride by the crystalline orientation (100) on said surface of said crystal element, and a degree of mismatch in lattice constant between said fluoride and said group IV-VI compound ferroelectric substance is small, so that said buffer film and said ferroelectric gate film both have crystalline orientation (111).

2. A field effect transistor according to claim 1, wherein the degree of mismatch in lattice constant between said group IIa fluoride and said group IV-VI compound ferroelectric substance is between almost 0% and 3.5%.

3. A field effect transistor according to claim 1, wherein the degree of mismatch in lattice constant between said group IIa fluoride and said surface of said crystal element of said substrate is at least approximately 6.8%.

4. A field effect transistor according to claim 3, wherein the degree of mismatch in lattice constant between said group IIa fluoride and said group IV-VI compound ferroelectric substance is between almost 0% and 3.5%.

5. A field effect transistor according to claim 1, wherein said buffer film has a uniform fluoride structure with a lattice constant such that:
   at a side of an interface between said buffer film and said surface of said crystal element of said semiconductor substrate a degree of mismatch in lattice constant between said buffer layer and said surface of said crystal element is large enough to avoid influence on the characteristics of crystalline orientation of said group IIa fluoride by the crystalline orientation (100) on said surface of said crystal element, and
   at a side of an interface between said buffer film and said ferroelectric gate film the lattice constant of said fluoride is close to the lattice constant of said group IV-VI compound ferroelectric substance.

6. A field effect transistor according to claim 5, wherein said buffer film is composed of a material selected from the group of materials consisting of $SrF_2$, $BaF_2$ and $Sr_xBa_{1-x}F_2$ ($0<x<1$).

7. A field effect transistor according to claim 1, wherein said buffer film has a two-layer fluoride structure, including
   a first layer having a crystalline orientation (111) and a first lattice constant, said first layer interfacing with said surface of said crystal element of said semiconductor substrate, a degree of mismatch between the first lattice constant and a lattice constant of said crystal element at the interface with the first layer, being large enough to avoid influence on the characteristics of crystalline orientation of said group IIa fluoride by the crystalline orientation (100) on said surface of said crystal element, and
   a second layer having a crystalline orientation (111) and a second lattice constant, said second layer interfacing with said ferroelectric film, the second lattice constant being close to the lattice constant of said group IV-VI compound ferroelectric substance.

8. A field effect transistor according to claim 7, wherein said first layer is composed of $Sr_xBa_{1-x}F_2$ ($0<x<1$) and said second layer is composed of a material selected from the group of materials consisting of $SrF_2$ and $BaF_2$.

9. A field effect transistor according to claim 1, wherein said buffer film is graded by varying an element ratio in order to vary the lattice constant thereof such that in a vicinity of said surface of said crystal element of said semiconductor substrate, a degree of mismatch between the lattice constants of said crystal element and said group IIa fluoride being large enough to avoid influence on the characteristics of crystalline orientation of said group IIa fluoride by the crystalline orientation (100) on said surface of said crystal element and enforce the (111) orientation of said group IIa fluoride, and in a vicinity of said ferroelectric film, the lattice constant of the buffer film is close to the lattice constant of said group IV-VI compound ferroelectric substance.

10. A field effect transistor according to claim 9, wherein said buffer film is composed of $Sr_xBa_{1-x}F_2$, wherein x has a value which is gradually increased from 0 to 0.5 toward the ferroelectric gate film.

11. A field effect transistor according to claim 1, wherein said semiconductor substrate is a silicon substrate and said crystal element is a silicon crystal.

12. A field effect transistor according to claim 11, wherein a film thickness of said ferroelectric gate film is set from several 100 to 1000 Å, and a film thickness of said buffer film is set from several 100 to 1000 Å.

13. A field effect transistor according to claim 12, wherein said ferroelectric substance is a material selected from the group of materials consisting of GeTe, $Pb_xGeTe_{1-x}$ ($0<x<1$), and $GeTe_xSe_{1-x}$ ($0<x<1$).

14. A field effect transistor according to claim 12, wherein said buffer film has a single-layer structure, composed of a material selected from the group of materials consisting of $SrF_2$, $BaF_2$ and $Sr_xBa_{1-x}F_2$ ($0<x<1$).

15. A field effect transistor according to claim 12, wherein said buffer film has a two-layer structure, including a first layer of $Sr_xBa_{1-x}F_2$ ($0<x<1$) and a second layer of a material selected from the group of materials consisting of $SrF_2$ and $BaF_2$.

16. A field effect transistor according to claim 12, wherein said buffer film is composed of $Sr_xBa_{1-x}F_2$ and has a graded structure in which x has a value which is gradually increased from 0 to 0.5 toward the ferroelectric gate film.

* * * * *